US006344754B1

(12) United States Patent
Tamai

(10) Patent No.: US 6,344,754 B1
(45) Date of Patent: *Feb. 5, 2002

(54) SEMICONDUCTOR CHIP, SEMICONDUCTOR DEVICE PACKAGE, PROBE CARD AND PACKAGE TESTING METHOD

(75) Inventor: Shigeki Tamai, Yoshino-gun (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,454

(22) Filed: Jan. 18, 2000

(30) Foreign Application Priority Data

Jan. 19, 1999 (JP) .......................................... 11-010440

(51) Int. Cl.[7] .............................................. G01R 31/26

(52) U.S. Cl. ..................................................... 324/765

(58) Field of Search ................................ 324/765, 755, 324/763, 756; 257/666, 668, 676, 685, 686, 690, 693, 697, 698; 438/107, 111, 121, 123, 129

(56) References Cited

U.S. PATENT DOCUMENTS 4,949,155 A * 8/1990 Tajima et al. ................. 357/68
4,956,602 A * 9/1990 Parrish ................... 324/158 R
5,237,201 A * 8/1993 Tanaki ........................ 257/666
5,349,233 A * 9/1994 Sasaki ........................ 257/666
5,371,390 A * 12/1994 Mohsen ...................... 257/209
5,446,395 A * 8/1995 Goto .......................... 324/763
5,608,335 A * 3/1997 Tailliet ....................... 324/763
5,780,925 A * 7/1998 Cipolla et al. .............. 257/626
5,946,546 A * 8/1999 Fillion et al. ................. 438/15
6,046,600 A * 4/2000 Whetsel ...................... 324/763

* cited by examiner

*Primary Examiner*—Safet Metjahic
*Assistant Examiner*—Etienne LeRoux
(74) *Attorney, Agent, or Firm*—Nixon & Vanderhye, P.C.

(57) ABSTRACT

The cost of production is reduced by effectively utilizing a substrate and reducing testing time. Adjoining two LCD driver chips mounted on a TCP are arranged with their input lead sides and output lead sides arranged opposite to each other, and the input testing terminals and the output testing terminals are commonized. With this arrangement, the mounting pitch of the LCD driver chips is reduced to effectively utilize a substrate, for the achievement of cost reduction. In this case, the input terminals of the same ordinal numbers are arranged so that they receive an electric power or a signal of an identical electric potential as an input when viewed from both ends of the LCD driver chips. Then, both the LCD drivers are concurrently tested by probing at one time by applying an input signal to an input testing terminal common to both the LCD drivers and concurrently measuring outputs from the respective output testing terminals. Cost reduction is achieved by thus reducing the testing time.

11 Claims, 13 Drawing Sheets

SEMICONDUCTOR CHIP, SEMICONDUCTOR DEVICE PACKAGE, PROBE CARD AND PACKAGE TESTING METHOD

BACKGROUND OF THE INVENTION

The present invention relates to a semiconductor chip on which an integrated circuit and the like for driving a display panel are formed. More particularly the present invention includes a semiconductor device package mounted with the semiconductor chip, a probe card for use in testing the semiconductor device package and a package testing method using the probe card.

Conventional methods for mounting an LCD (liquid crystal display) driver chip on an LCD device include the COG (chip on glass) mounting method for directly mounting the chip on a lower glass substrate of an LCD panel and the TCP (tape carrier package) mounting method. In the TCP mounting method, a tape-shaped TCP on which the LCD driver chip is mounted is used, and the LCD driver chip is mounted on the periphery of the LCD panel by bonding electrodes provided on the lower glass substrate of the LCD panel and a conductor pattern on the TCP via ACF (anisotropic conductive film) in a thermocompression bonding manner.

The above-mentioned TCP is constructed as shown in FIG. 10. In FIG. 10, a plurality of LCD drivers 2, 2, . . . are mounted at regular intervals in a line in a specified direction on a tape-shaped substrate 1. Each LCD driver 2 is constructed of an LCD driver chip 3, input leads 4, output leads 5, input testing terminals 6 and output testing terminals 7. Then, each LCD driver 2 is punched according to a TCP punching size indicated by the dashed lines 8 and formed into the final shape of the LCD driver 2.

Each LCD driver chip 3, to be arranged on the substrate 1, is placed in a position where the coordinate of the centers of sprocket holes 9 and 10 formed at regular intervals on both sides of the substrate 1 coincide with the coordinate of the center of the LCD driver chip 3 in the lengthwise direction (see the LCD driver chip 3 located in the rightmost position on FIG. 10). Therefore, LCD driver chips 3 are arranged at intervals of an integral multiple of the pitch of the sprocket holes 9, 10. For example, the pitch of the sprocket holes 9, 10 is standardized to 4.75 mm according to JIS in the case of an LCD driver 2 having a length of 6.0 mm from the leading end of the input testing terminals 6 to the trailing end of the output testing terminals 7. Therefore, LCD drivers 2 are to be arranged at two-pitch intervals of the sprocket holes 9, 10.

The output testing terminals 7 will be described next. Although the output testing terminals 7 are simply illustrated as being in a line in FIG. 10, the practical arrangement is such that every four terminals are arranged in four columns in the lengthwise direction of the substrate 1, as shown in FIG. 11. The multi-column arrangement of the output testing terminals 7 is determined according to the number of output terminals of the LCD driver chip 3, the minimum allowable size of the output testing terminal 7 determined by the probe pitch of a prober and the TCP width.

On the other hand, through the years, there has been examined a method for reducing the number of LCD drivers 2 to be used per LCD device by increasing the number of outputs of each LCD driver 2 in order to reduce the cost of the LCD module. According to this method, the multi-column arrangement of the output testing terminals 7 as described above is the indispensable condition, and the multi-column arrangement of four to six or more columns has been adopted depending on the number of outputs.

However, the aforementioned conventional TCP construction has the following problems. That is, according to the aforementioned TCP construction, the output testing terminals 7 are arranged in a multiplicity of columns. Therefore, the length from the foremost end of the input testing terminal 6 to the hindmost end of the output testing terminal 7 becomes long, and consequently the length of the substrate 1 becomes long. Then, the requirement that the arrangement pitch of the LCD driver chips 3 must be an integral multiple of the pitch of the sprocket holes 9, 10 standardized to 4.75 mm conspires to further increase the length of the substrate 1. Therefore, the substrate 1 is not effectively utilized. As a result, the cost per LCD driver 2 is disadvantageously increased.

SUMMARY OF THE INVENTION

Therefore, the object of the present invention is to provide a low cost semiconductor chip by effectively utilizing the substrate and reducing the testing time thereof. The present invention includes a semiconductor device package mounted with the semiconductor chip, a probe card for use in testing the semiconductor device package and a package testing method using the probe card.

In order to achieve the aforementioned object, the present invention provides a semiconductor chip having input terminals into which electric powers and signals are inputted, wherein the input terminals are arranged so that electric powers of an identical electric potential or signals of an identical electric potential are supplied to the input terminals of same ordinal number when the terminals are viewed from both sides of the semiconductor chip.

According to the above construction, the input sequence of the signal to be inputted to the input terminal array of the semiconductor chip may be reversed. Furthermore, if the two semiconductor chips are arranged with their input terminals arranged opposite to each other, then the input terminals to which the electric power of an identical electric potential or the signal of an identical electric potential is inputted are arranged opposite to each other. Therefore, in the above case, no electric power short circuit occurs even when an identical electric power is supplied to the input terminals that are opposite to each other.

In one embodiment, adjoining two semiconductor chips are arranged so that a direction of either one of the chips is rotated at an angle of 180 degrees relative to the other.

According to the above construction, the adjoining two semiconductor chips are arranged in opposite directions. Therefore, the above construction enables the inputting of an identical electric power or signal to the input terminals that belong to the adjoining two semiconductor chips and are opposite to each other and enables the reduction of arrangement pitch by commonizing the input testing terminals of both the semiconductor chips.

In one embodiment, mutually opposite input terminals of the adjoining two semiconductor chips are connected together by way of an input lead, and mutually opposite output terminals of the adjoining two semiconductor chips are connected together by way of an output lead.

According to the above construction, the distance between the input terminals and the distance between the output terminals of the adjoining two semiconductor chips can be reduced, and this allows the arrangement pitch per semiconductor chip to be reduced.

In one embodiment, the input lead is provided with an input testing terminal common to the adjoining two semiconductor chips, and the output lead is provided with an output testing terminal common to the adjoining two semiconductor chips.

According to the above construction, the input testing terminal of either one of the adjoining two semiconductor chips and the output testing terminal of either one of the adjoining two semiconductor chips are eliminated, and this allows the distance between the input terminals and the distance between the output terminals to be reduced. The arrangement pitch per semiconductor chip is thus reduced.

The present invention also provides a semiconductor chip having input terminals into which an electric powers and signals are inputted, wherein the input terminals are arranged so that electric powers of an identical electric potential or signals of an identical electric potential are supplied to part of input terminal pairs of same ordinal numbers when the terminals are viewed from both sides of the semiconductor chip.

According to the above construction, the signals to be inputted to the pair of input terminals to which the electric power of an identical electric potential or the signal of an identical electric potential is inputted may be reversed in the input terminals of the same ordinal numbers viewed from both ends of the semiconductor chip. Furthermore, if the two semiconductor chips are arranged with their input terminals arranged opposite to each other, then the input terminals to which the electric power of an identical electric potential or the signal of an identical electric potential is inputted are arranged opposite to each other. Therefore, no electric power short circuit occurs even when an identical electric power is supplied to the input terminals that are opposite to each other.

In one embodiment, adjoining two semiconductor chips are arranged so that a direction of either one of the chips is rotated at an angle of 180 degrees relative to the other.

According to the above construction, the adjoining two semiconductor chips are arranged in mutually opposite directions. Therefore, an identical electric power or signal can be inputted to the mutually opposite input terminals which belong to the adjoining two semiconductor chips and to which the electric power of an identical electric potential or the signal of an identical electric potential is to be inputted.

In one embodiment, the two semiconductor chips of which the input terminals are arranged opposite to each other function as a pair, and mutually opposite output terminals of the adjoining two semiconductor chips are connected together by way of an output lead.

According to the above construction, the distance between the output terminals of the adjoining two semiconductor chips can be reduced, and this allows the arrangement pitch per semiconductor chip to be reduced.

In one embodiment, among the input terminals that are arranged opposite to each other in the two semiconductor chips that function as a pair, input terminals related to at least one pair to which the electric powers of an identical electric potential or the signals of an identical electric potential are supplied are connected together by way of a connection lead.

According to the above construction, the pair of input terminals that belong to the adjoining two semiconductor chips functioning as a pair and are connected by way of the connection lead can be commonized.

In one embodiment, the output lead is provided with an output testing terminal common to the adjoining two semiconductor chips, an input testing terminal is connected to the input terminal of each semiconductor chip and the connection lead is provided between the mutually opposite input testing terminals.

According to the above construction, the output testing terminal of either one of the adjoining two semiconductor chips is eliminated, and this allows the distance between the output terminals to be reduced. The arrangement pitch per semiconductor chip is thus reduced.

In one embodiment, the package is a tape carrier package obtained by mounting the semiconductor chip on a tape-shaped substrate.

According to the above construction, the distance between the mutually opposite input terminals or the distance between the mutually opposite output terminals of the adjoining two semiconductor chips mounted on the tape-shaped substrate is reduced, by which the arrangement pitch of the semiconductor chip is reduced. Thus, the substrate is effectively utilized, achieving cost reduction.

In one embodiment, the package is a chip on film mounting package obtained by mounting the semiconductor chip on a rectangular substrate.

According to the above construction, the distance between the mutually opposite input terminals or the distance between the mutually opposite output terminals of the adjoining two semiconductor chips mounted on the rectangular substrate is reduced, by which the arrangement pitch of the semiconductor chip is reduced. Thus, the substrate is effectively utilized, achieving cost reduction.

A probe card of one embodiment comprises:

probes arranged so as to be able to be concurrently connected to the input testing terminal common to the adjoining two semiconductor chips and the output testing terminals of the adjoining two semiconductor chips, whereby the adjoining two semiconductor chips can be tested by probing at one time.

According to the above construction, the input testing terminal to be probed by the probe card is the input testing terminal common to the adjoining two semiconductor chips. Then, the input terminals of the adjoining two semiconductor chips are arranged so that the electric powers of an identical electric potential or the signals of an identical electric potential are inputted to the input terminals of the same ordinal numbers when viewed from both ends of the respective semiconductor chips. Therefore, by supplying the signal and the electric power to the input testing terminal common to the adjoining two semiconductor chips and detecting the outputs of the respective output testing terminals of the semiconductor chips by means of the probe card, the adjoining two semiconductor chips are tested by proving at one time without a hitch.

A probe card of one embodiment comprises:

probes arranged so as to be able to be concurrently connected to the output testing terminal common to the adjoining two semiconductor chips and the input testing terminals of the adjoining two semiconductor chips, whereby the adjoining two semiconductor chips can be tested by probing at one time.

According to the above construction, the output testing terminal to be probed by the probe card is the output testing terminal common to the adjoining two semiconductor chips. Therefore, by independently supplying the signals and the electric powers to the respective input testing terminals of the adjoining two semiconductor chips and successively detecting the output from the output testing terminal common to both the semiconductor chips, the adjoining two semiconductor chips are tested by probing at one time.

A probe card of one embodiment comprises:

probes arranged so as to be able to be concurrently connected to the input testing terminals of the two semiconductor chips that function as a pair and the output testing terminals of the two semiconductor chips, whereby the two semiconductor chips that function as a pair can be tested by probing at one time.

According to the above construction, if the input terminals of the two semiconductor chips that function as a pair are arranged so that the electric powers of an identical electric potential or the signals of an identical electric potential are inputted to the input terminals of the same ordinal numbers when viewed from both ends of the respective semiconductor chips, then the test is executed as follows. That is, the identical signal and electric power are concurrently supplied to the input testing terminals of the two semiconductor chips, and the outputs of the output testing terminals of both the semiconductor chips are concurrently detected. The two semiconductor chips that function as a pair are thus tested by probing at one time.

Furthermore, if part of the input terminals of the two semiconductor chips that function as a pair are arranged so that the electric powers of an identical electric potential or the signals of an identical electric potential are inputted to the input terminals of the same ordinal numbers when viewed from both ends of the respective semiconductor chips, then the test is executed as follows. That is, the signal and the electric power are supplied to the input testing terminals of either one of the two semiconductor chips, and the output of the output testing terminal of the above semiconductor chip is detected. Next, the signal and the electric power are supplied to the input testing terminals of the other semiconductor chip, and the output of the output testing terminal of the above semiconductor chip is detected. The two semiconductor chips that function as a pair are thus tested by probing at one time.

A probe card of one embodiment comprises:

probes arranged so as to be able to be concurrently connected to the output testing terminal common to the adjoining two semiconductor chips and the input testing terminals of the adjoining two semiconductor chips, whereby the adjoining two semiconductor chips can be tested by probing at one time.

According to the above construction, the output testing terminal to be probed by the probe card is the output testing terminal common to the adjoining two semiconductor chips. Therefore, by independently supplying the signals and the electric powers to the input testing terminals of the adjoining two semiconductor chips and successively detecting the outputs from the output testing terminal common to both the semiconductor chips, the adjoining two semiconductor chips are tested by proving at one time.

A package testing method of one embodiment comprises the step of:

applying mutually reversed signal input sequences or mutually reversed signal detection sequences to the adjoining two semiconductor chips with regard to at least one of the input testing terminals and the output terminals of the semiconductor chips when testing the adjoining two semiconductor chips by probing at one time.

According to the above construction, the sequence of signal input or the sequence of signal detection to or from the input testing terminals or the output terminals of one of the adjoining two semiconductor chips is reversed relative to the corresponding sequence of the input testing terminal or the output terminal of the other semiconductor chip. Therefore, the signal input or the signal detection of the adjoining two semiconductor chips are independently executed with the input testing terminals or the output terminals of the adjoining two semiconductor chips kept probed. That is, the test of the adjoining two semiconductor chips is independently executed by proving at one time.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
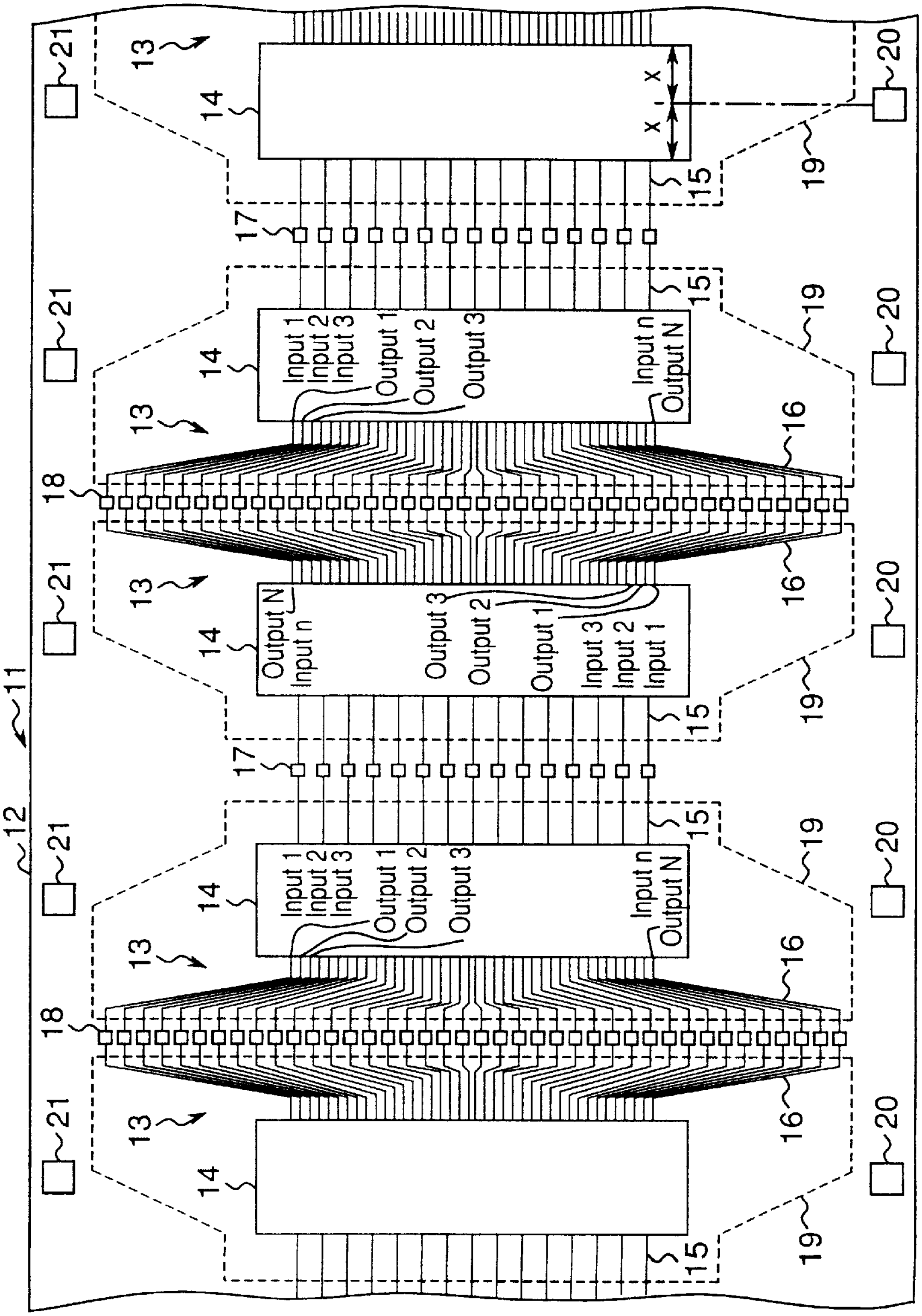
FIG. 1 is a plan view of a TCP that serves as a semiconductor device package of the present invention.

The present invention will be described in detail below on the basis of the embodiments shown in the drawings.

(First Embodiment)

FIG. 1 is a plan view of a TCP that serves as a semiconductor device package according to the first embodiment. A TCP 11 is provided by mounting a plurality of LCD drivers 13, . . . on a tape-shaped substrate 12. Each LCD driver 13 is constructed of an LCD driver chip 14, input leads 15, output leads 16, input testing terminals 17 and output testing terminals 18, similarly to the conventional TCP shown in FIG. 10. Then, the final LCD driver 13 is formed by punching according to a TCP punching size as indicated by the dashed lines 19.

In the TCP 11 of the present embodiment, the LCD driver chips 14 and 14 of the mutually adjoining two LCD drivers

13 and 13 are arranged with their input leads 15 or output leads 16 arranged opposite to each other, and the input testing terminals 17 or the output testing terminals 18 of the mutually adjoining two LCD drivers 13 are made in common. It is to be noted that each LCD driver chip 14 arranged on the substrate 12 is placed in a position where the coordinate of the centers of sprocket holes 20 and 21 formed at regular intervals on both sides of the substrate 12 coincides with the coordinate of the center of the LCD driver chip 14 in the lengthwise direction (see the LCD driver chip 14 located in the rightmost position in the figure), similarly to the case of the conventional TCP shown in FIG. 10.

Figure 2:
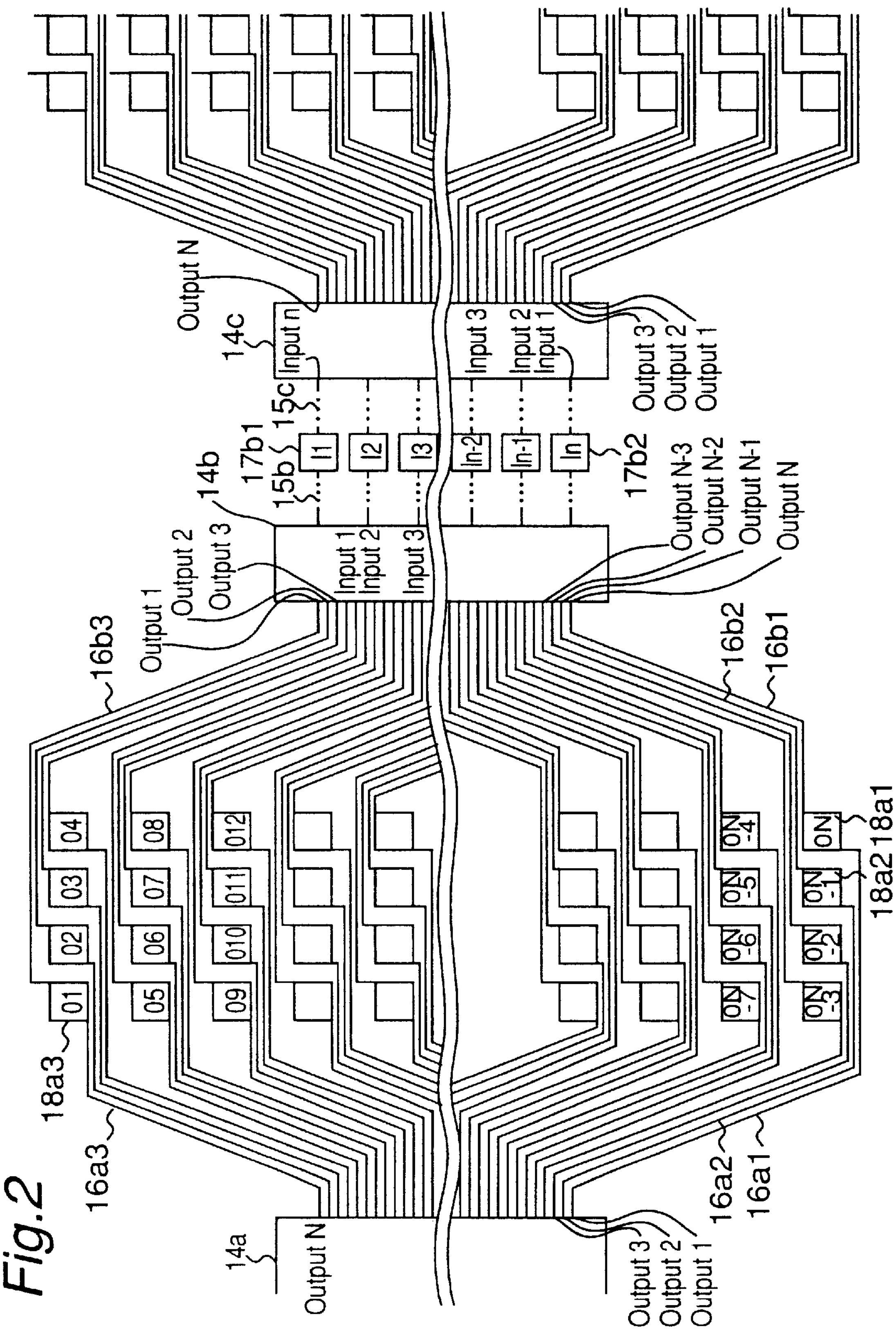
FIG. 2 is a view showing a practical arrangement of the output testing terminals of FIG. 1.

The output testing terminal 18 and the input testing terminal 17 will be described next. Although the arrangement of the output testing terminals 18 is simply illustrated in a line in FIG. 1, the practical arrangement is such that every four terminals are arranged in four columns in the lengthwise direction of the substrate 12, as shown in FIG. 2. It is to be noted that the output terminal 1 of an LCD driver chip 14*a* is connected to an output testing terminal 18$a_1$ (ON) via an output lead 16$a_1$ and further connected to the output terminal N of an LCD driver chip 14*b* via an output lead 16$b_1$ in the present embodiment. Likewise, the output terminal 2 of the LCD driver chip 14*a* is connected to an output testing terminal 18$a_2$ (ON-1) via an output lead 16$a_2$ and further connected to the output terminal (N-1) of the LCD driver chip 14*b* via an output lead 16$b_2$. Likewise, the output terminal N of the LCD driver chip 14*a* is connected to the output terminal 1 of the LCD driver chip 14*b* via an output testing terminal 18$a_3$ (O1).

On the other hand, the input terminal 1 of the LCD driver chip 14*b* is connected to an input testing terminal 17$b_1$ (I1) via an input lead 15*b* and further connected to the input terminal n of an LCD driver chip 14*c* via an input lead 15*c*. Likewise, the input terminal n of the LCD driver chip 14*b* is connected to the input terminal 1 of the LCD driver chip 14*c* via an input testing terminal 17$b_2$ (In).

As described above, in the present embodiment, the mutually opposite output terminals of the adjoining LCD driver chip 14*a* and the LCD driver chip 14*b* are connected together via an output testing terminal 18*a*. On the other hand, the mutually opposite input terminals of the adjoining LCD driver chip 14*b* and the LCD driver chip 14*c* are connected together via the input testing terminal 17*b*. With this arrangement, the mounting pitch of the LCD driver chips 14 on the substrate 12 can be reduced, and this allows the increase in number of the LCD driver chips 14 to be arranged on the substrate 12. Therefore, the substrate 12 can be effectively utilized, allowing the cost per LCD driver 13 to be reduced.

Figure 3:
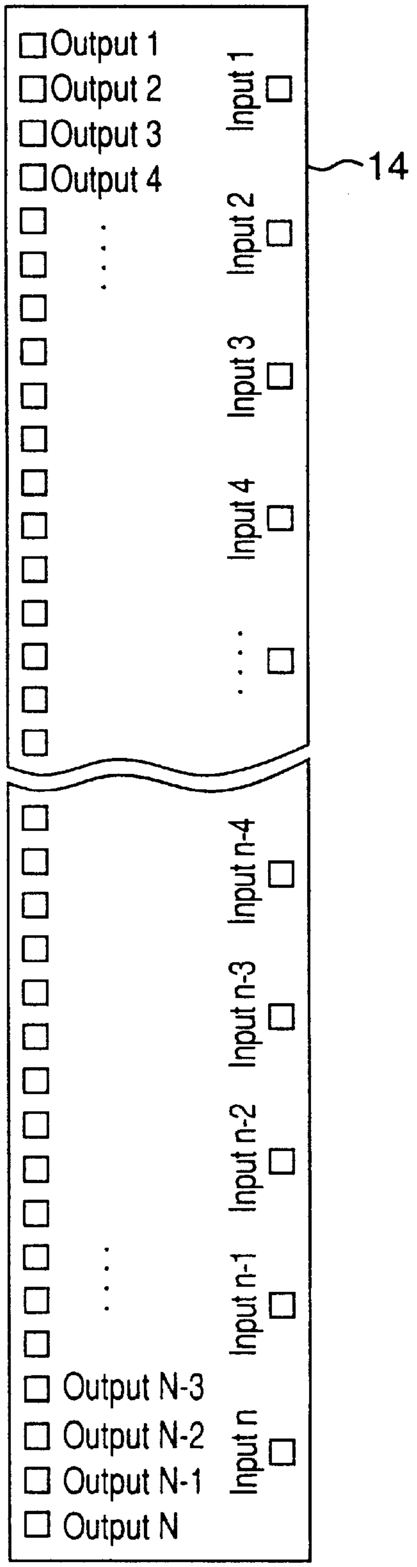
FIG. 3 is a view showing an example of the terminal arrangement of the LCD driver chip of FIG. 1.

FIG. 3 shows the terminal arrangement of the above LCD driver chip 14. In the present embodiment, it is not permitted to cause the electric power short circuit or the like between the terminals that are connected together for the reason that the input terminal sides of the LCD driver chips 14 are arranged oppositely and connected together and the output terminal sides are arranged oppositely and connected together. Therefore, in FIG. 3, it is required to provide an arrangement such that an electric power of an identical electric potential or a signal of an identical electric potential is inputted to the input terminals of the same ordinal numbers in view of both ends, such as the combination of the input terminal 1 and the input terminal n, the combination of the input terminal 2 and the input terminal (n−1) and the combination of the input terminal 3 and the input terminal (n−2), when the terminals are viewed from both ends of the LCD driver chips 14.

In general, referring to the terminals of the electric power among the input terminals of the LCD driver chip 14, for example, the GND is inputted to the input terminal 1 and the input terminal n and further connected to the inside of the LCD driver chip 14 by internal wiring. The other electric power Vcc is inputted to the input terminal 2 and the input terminal (n−1) and further connected to the inside by internal wiring. As described above, concerning the terminals of the electric powers including the electric power to be applied to the LCD, the arrangement of the terminals has a symmetrical property as represented by the combination of the input terminal 1 and the input terminal n and the combination of the input terminal 2 and the input terminal (n−1) and so on with regard to the electric potentials of the input terminals of the LCD driver chips 14. That is, the input terminals are arranged so that the electric power input of an identical electric potential is inputted to the input terminals of the same ordinal numbers when the terminals are viewed from both ends of the LCD driver chip 14, as a matter of course.

Therefore, in FIG. 2, the normal application is also achieved even when both the input terminals of the input terminals 1 and n of the LCD driver chip 14*b* are connected to the input terminals n and 1, respectively, of the LCD driver chip 14*c* and supplied with an identical electric power. Therefore, according to the present embodiment, the input terminals 1 and n of the LCD driver chip 14*b* and the input terminals n and 1 of the LCD driver chip 14*c,* which are opposite to each other, are connected together via the input testing terminals 17$b_1$ (I1) and 17$b_2$ (In), for the achievement of saving of the substrate 12.

The electric power terminals have been described above. In regard to the signal input terminals other than the electric power terminals, if there are input terminals arranged symmetrically similarly to the aforementioned electric power terminals, then the input terminal is also connected to the input terminal opposite to the input terminal via the input testing terminal 17. With this arrangement, an appropriate control signal can be concurrently inputted from the common input testing terminal 17*b* to the LCD driver chip 14*b* and the LCD driver chip 14*c*. By concurrently measuring both outputs 1 through both outputs N from the output testing terminals 18 and 18 of the respective LCD driver chips 14*b* and 14*c,* both the LCD driver chips 14*b* and 14*c* can be concurrently tested.

Figure 4:
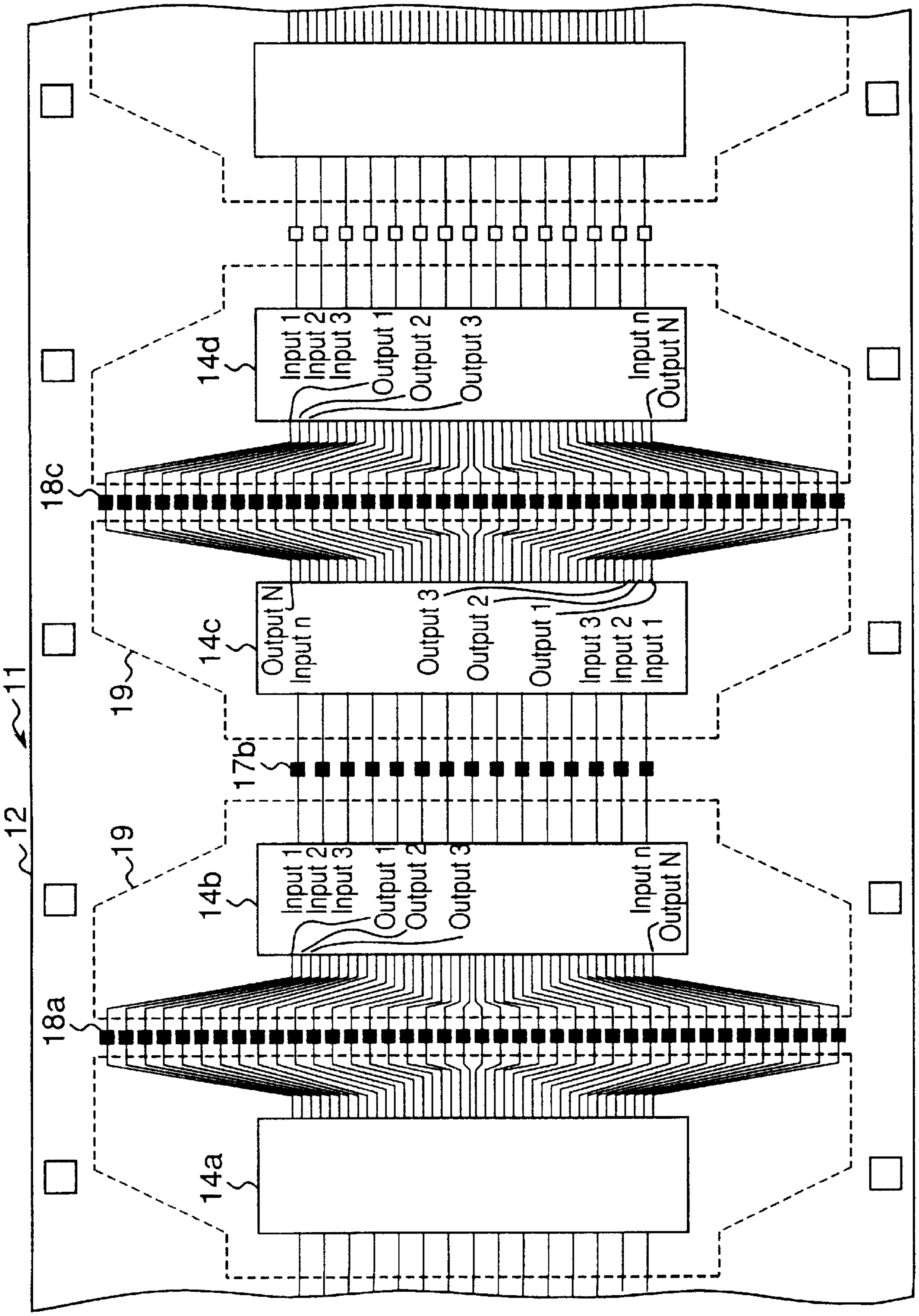
FIG. 4 is a view showing the probe positions of a TCP testing probe card for the TCP of FIG. 1.
Figure 12:
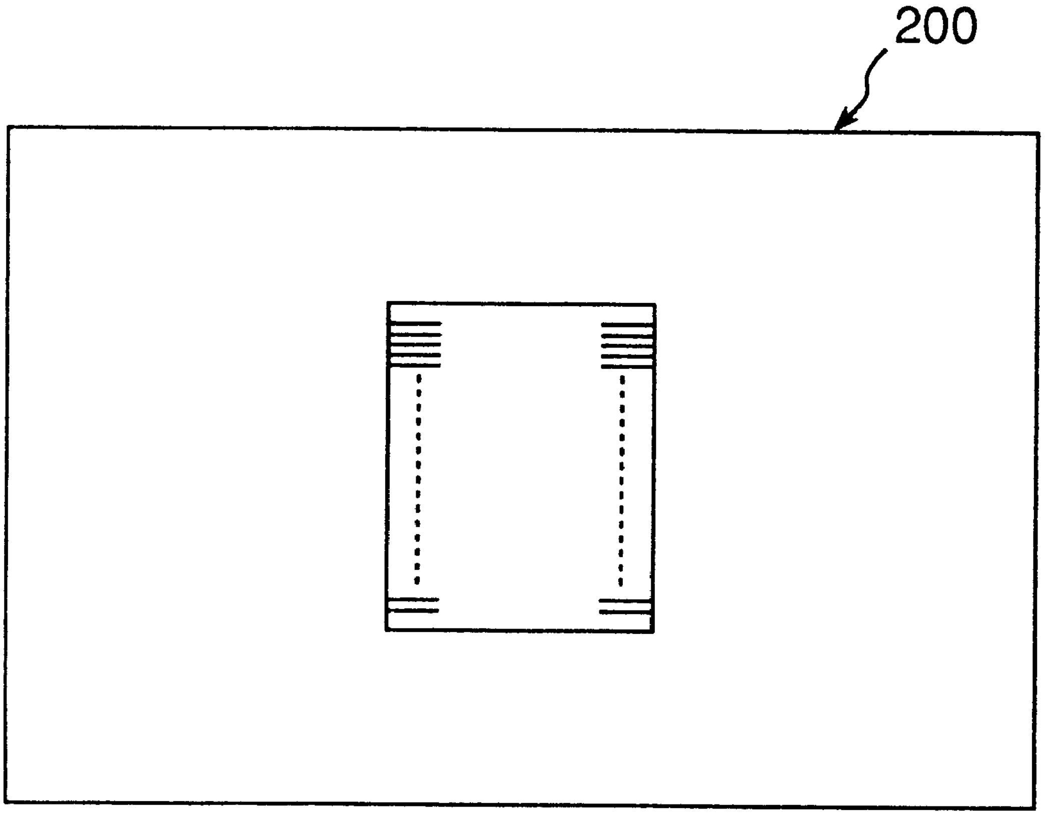
FIG. 12 is a view showing a probe card.

FIG. 4 shows the probe positions of a TCP testing probe card 200 shown in FIG. 12. When testing the LCD driver chips 14*b* and 14*c,* the probes of the probe card 200 are applied to the input testing terminal 17*b* indicated in black and the output testing terminals 18*a* and 18*c* indicated in black in FIG. 4. By thus concurrently applying the input signal to the input testing terminals 17*b* of the LCD driver chip 14*b* and the LCD driver chip 14*c,* the outputs of the LCD driver chip 14*b* and the LCD driver chip 14*c* can be concurrently observed.

As described above, once the probes of the probe card 200 are applied, the two LCD driver chips 14 and 14 can be concurrently tested. This enables not only the reductions of the time for moving up and down the probe card 200 per test of one LCD driver chip 14 and the time for the movement and positional alignment of the probe card to the next LCD driver chip 14 to be tested but also the reduction of the time for the test itself. Therefore, according to the present embodiment, the testing time of the LCD driver chip 14 mounted on the TCP 11 can be reduced, allowing cost reduction to be achieved. It is to be noted that the output of one LCD driver chip 14 may be measured every time the probes of the probe card are applied once.

The number of probes of the probe card 200 in this case becomes the sum total of the number two times the number of the output terminals and the input terminals of the LCD driver chip 14, and accordingly, it is anticipated that the price of the probe card 200 becomes high. However, since the two LCD driver chips 14 and 14 can be concurrently tested, the cost reduction can be achieved by the reduction of the testing time.

In this case, when concurrently testing the LCD driver chip 14*b* and the LCD driver chip 14*c,* no electric power is supplied to the LCD driver chip 14*a* and the LCD driver chip 14*d* via the probes of the probe card 200. Therefore, the output terminals 1 through N of both the LCD driver chips 14*a* and 14*d* have high impedance. Therefore, no problem occurs in testing the outputs of the output terminals 1 through N of the LCD driver chips 14*b* and 14*c* to be tested. It is to be noted that the probe card and the probes can be provided by using the known techniques, and therefore, no description is provided therefor herein.

Figure 5:
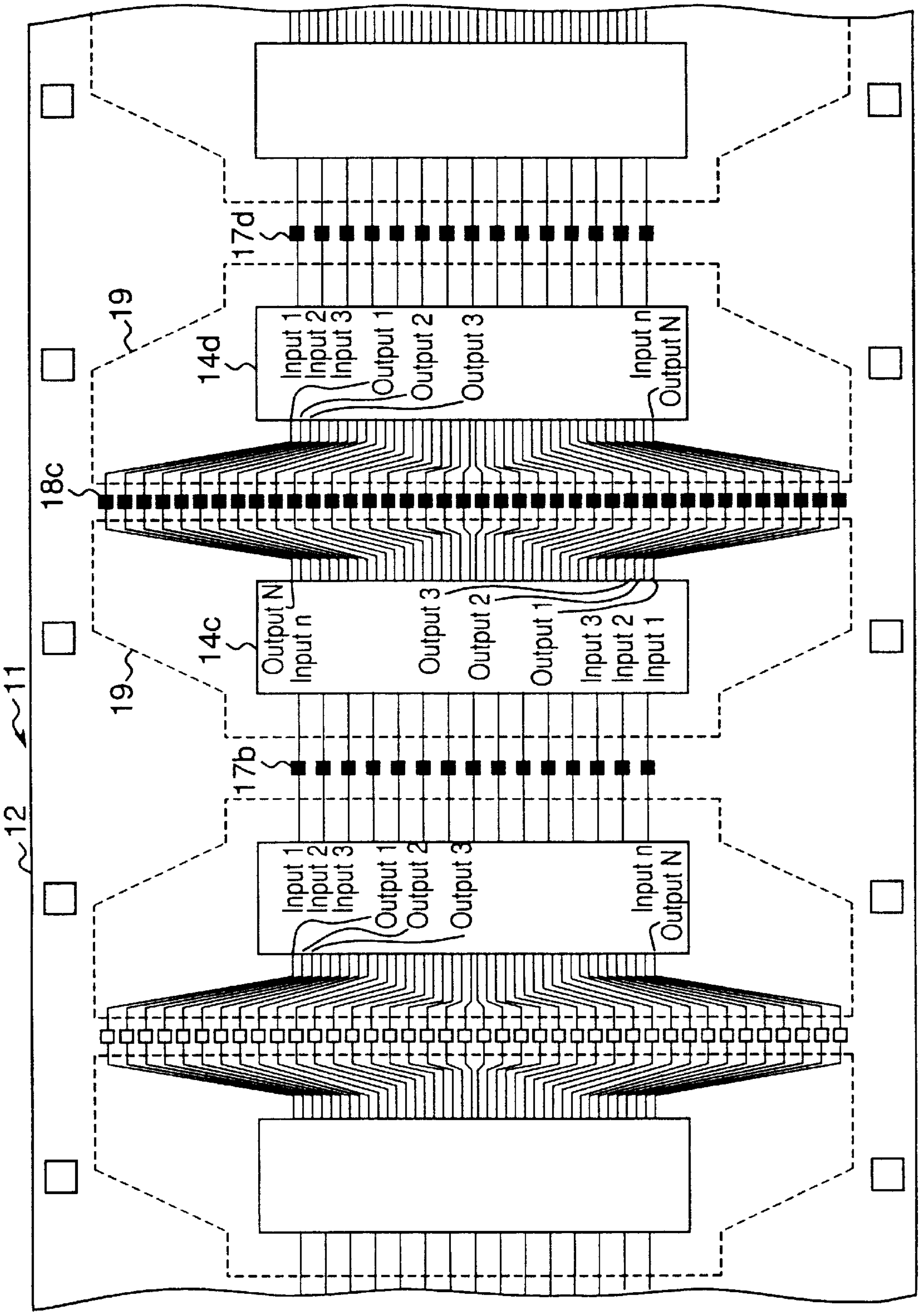
FIG. 5 is a view showing the probe positions of a TCP testing probe card different from those of FIG. 4.

FIG. 5 is an explanatory view of the probe positions of the TCP testing probe card different from those of FIG. 4. When testing the LCD driver chips 14*c* and 14*d,* the probes of the probe card are applied to the input testing terminals 17*b* and 17*d* indicated in black and an output testing terminal 18*c* indicated in black in FIG. 5. In this case, it is allowed to apply independent input signals to the input testing terminal 17*b* of the LCD driver chip 14*c* and the input testing terminal 17*d* of the LCD driver chip 14*d* and to individually observe the outputs by the output testing terminal 18*c* common to both the LCD driver chips 14*c* and 14*d.* The number of probes of the probed card becomes the sum total of the number of output terminals and a number two times the number of input terminals of the LCD driver chip 14, differently from the case of FIG. 4. In this case, the number of input terminals of the LCD driver chip 14 is generally smaller than the number of output terminals. Therefore, the number of probes of the probe card in FIG. 5 is allowed to be smaller than the number of probes in FIG. 4. Therefore, the price of the probe card can be reduced to a price that is slightly higher than that of the conventional probe card.

It is required to bring the output of the LCD driver chip 14*d* into a high impedance state when testing the LCD driver chip 14*c* and bring the output of the LCD driver chip 14*c* into a high impedance state when testing the LCD driver chip 14*d.* When testing the LCD driver chip 14*c,* a specified voltage is applied to the input testing terminal 17*b* and the input testing terminal 17*d* is made open. When testing the LCD driver chip 14*d,* a specified voltage is applied to the input testing terminal 17*d* and the input testing terminal 17*b* is made open. In the case of the probe positions of the TCP testing probe card shown in FIG. 5, there is a method for inserting a switch or the like in the output stage (see FIG. 2) of the LCD driver chip 14.

For example, an analog switch is provided immediately behind all the output terminals (output terminal 1 through the output terminal N) of the LCD driver chip 14. When testing the LCD driver chip 14*c,* by turning on the analog switch provided at each output terminal of the LCD driver chip 14*c* and turning off the analog switch provided at each output terminal of the LCD driver chip 14*d* for the achievement of the high impedance state, the test is allowed to be achieved. It is proper to set the operations of turning on and off the analog switch by the signal from the corresponding input terminal. For example, if the level of the input signal to the corresponding input terminal is "L" ("H"), then the analog switches of the output terminal 1 through the output terminal N are to be all turned off (turned on) in terms of circuit construction. The analog switch can be provided by the known technique of a MOS (metal-oxide semiconductor) switch, a transmission gate or the like.

By using the analog switch as described above, specified signals and electric powers are first supplied to the input terminal 1 through the input terminal n of the LCD driver chip 14*c* in a state in which the probes of the probe card are applied to the input testing terminals 17*b* and 17*d* indicated in black and the output testing terminal 18*c* indicated in black in FIG. 5, and the output terminal 1 through the output terminal N of the LCD driver chip 14*c* are measured at the output testing terminal 18*c* (in this case, the output terminal 1 through the output terminal N of the LCD driver chip 14*d* are in the high impedance state). Subsequently, the test can be executed by switching the analog switches and bringing the outputs 1 through N of the LCD driver chip 14*d* into the same state as the aforementioned state (in this case, the output terminal 1 through the output terminal N of the LCD driver chip 14*c* are in the high impedance state). It is to be noted that the output terminals of the LCD driver chip 14*c* and the LCD driver chip 14*d* have mutually reversed correspondence to the probes of the probe card at the time of testing in the case of this example.

As shown in FIG. 4 or FIG. 5, after executing a test by applying the probes of the probe card to the input testing terminals 17 and the out put testing terminals 18 and determining whether or not the LCD driver chip 14 is good, individual TCPs are formed by punching according to the TCP punching size indicated by the dashed lines 19 in the figure. In the above description, no explanation has been provided for a solder resist for protecting the TCP 11 and the LCD driver chip 14, a resin for encapsulating the LCD driver chip 13 and a method for mounting the LCD driver 13 on the substrate 12, because they are known techniques.

As described above, in the present embodiment, the mutually adjoining two LCD driver chips 14 and 14 on the TCP 11 are arranged with their input leads 15 or output leads 16 arranged to oppose each other, and to have common input testing terminals 17 or output testing terminals 18. With this arrangement, the mounting pitch of the LCD driver chips 14 on the substrate 12 can be reduced, and the number of LCD driver chips 14 to be arranged on the substrate 12 can be increased. The above-mentioned effects are remarkable particularly when the output testing terminals 18 are arranged in a plurality of columns as shown in FIG. 2.

Figure 10:
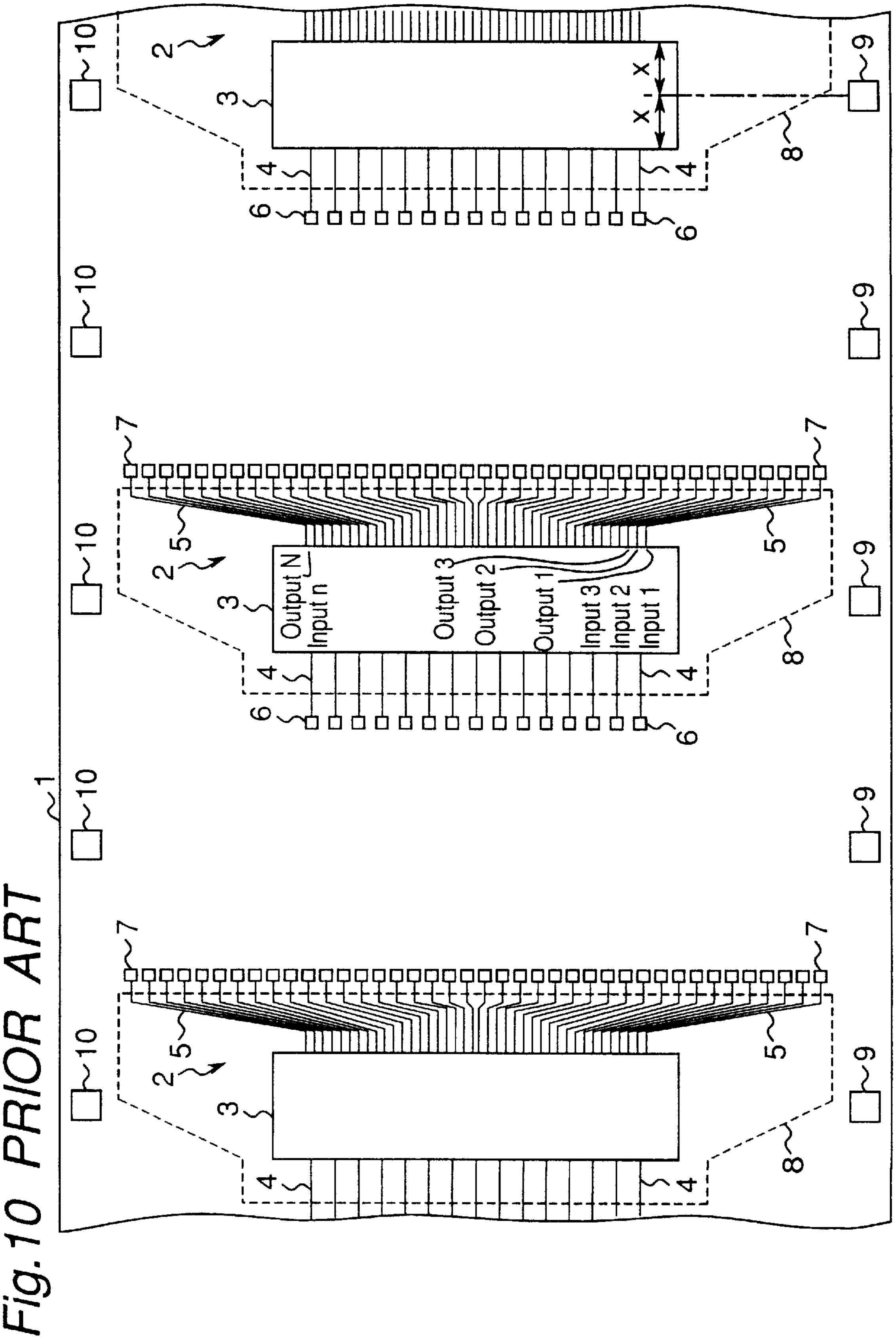
Fig.10 PRIOR ART
FIG. 10 is a plan view of the conventional TCP.
Figure 11:
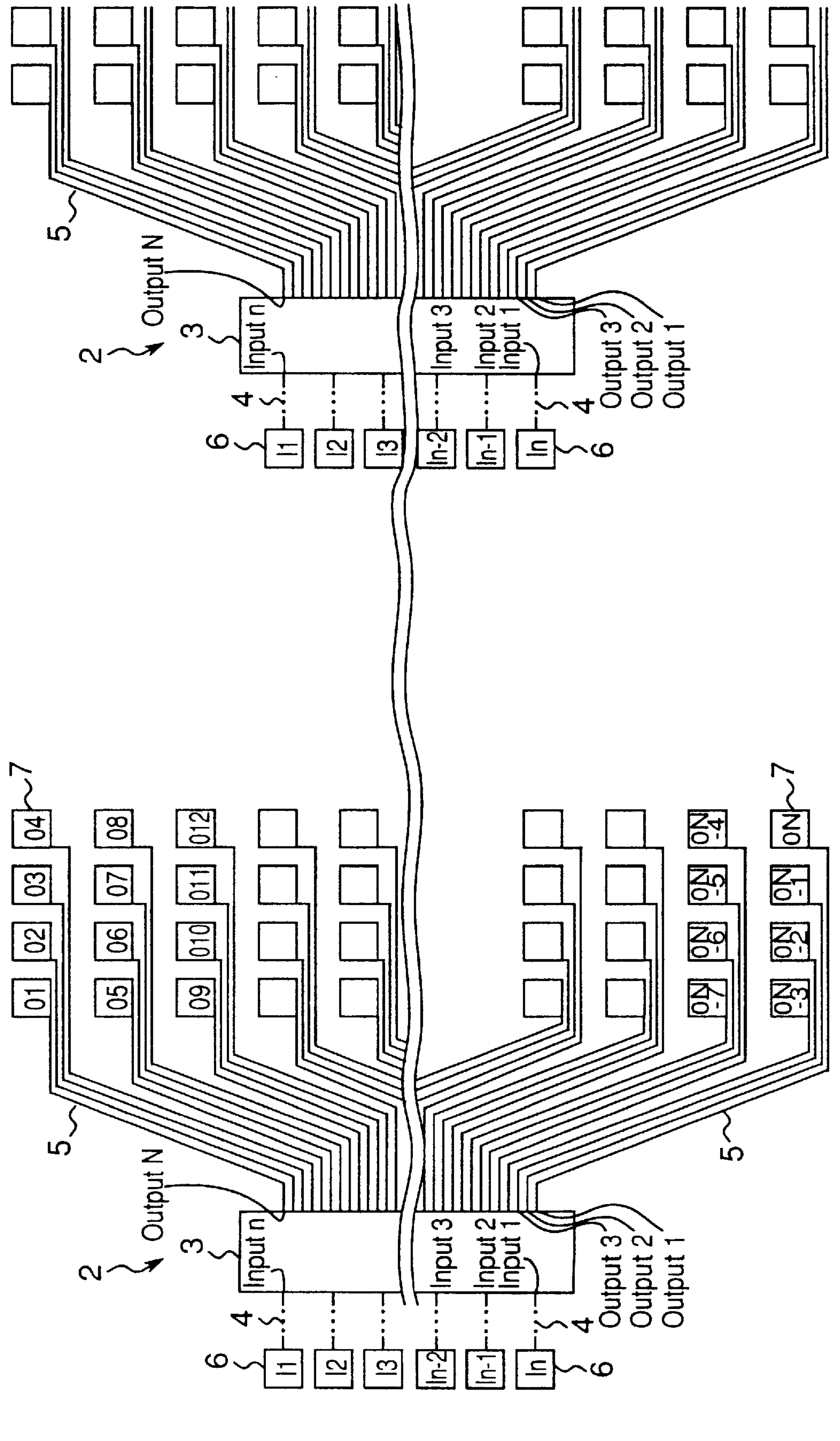
Fig.11 PRIOR ART
FIG. 11 is a view showing a practical arrangement of the output testing terminals of FIG. 10.

For example, in the case of the conventional TCP shown in FIG. 10, LCD drivers 2 each having a length of 6.0 mm from the leading end of the input testing terminals 6 to the trailing end of the output testing terminals 7 are arranged at two-pitch intervals of the sprocket holes 9, 10, and the length of the substrate 1 per LCD driver 2 is 9.5 mm (=4.75 mm×2). In contrast to this, in the case of the first embodiment, the input testing terminals 17 and the output testing terminals 18 of one LCD driver can be eliminated per two LCD drivers, and two LCD drivers 13 can be arranged at two-pitch intervals of the sprocket holes 20, 21. In the above case, the length of the substrate 1 per LCD driver is 4.75 mm. Therefore, the substrate 12 can be effectively utilized, allowing cost reduction to be achieved.

In the above case, the input terminals of the same ordinal numbers viewed from both ends of the LCD driver chip 14 are arranged so as to receive an electric power of an identical electric potential and a signal of an identical electric potential. Therefore, the above arrangement allows the input terminals into which the electric power of an identical electric potential or the signal of an identical electric potential are inputted among the input terminals 1 through n of the LCD driver chip 14*b* and the input terminals n through 1 of the LCD driver chip 14*c* that are opposite to each other to be connected via the input testing terminals $17b_1$ (I1) through $17b_2$ (In), allowing the achievement of saving of the substrate 12. With this arrangement, both the LCD driver chips 14*b* and 14*c* can be tested by applying the input signal to the input testing terminal 17*b* common to the LCD drivers 14*b* and 14*c* and concurrently measuring the outputs from the output testing terminals 18*a* and 18*c* of both the LCD driver chips 14*b* and 14*c* or by independently applying the input signal to the input testing terminals 17*b* and 17*d* of the LCD drivers 14*c* and 14*d* and alternately measuring the outputs from the output testing terminal 18*c* common to the LCD driver chips 14*c* and 14*d*. By thus reducing the testing time of the LCD driver chip 14, cost reduction at the testing time can be achieved.

(Second Embodiment)

The present embodiment is related to a TCP mounted with a LCD driver in which a construction is constructed of two LCD driver chips.

Figure 6:
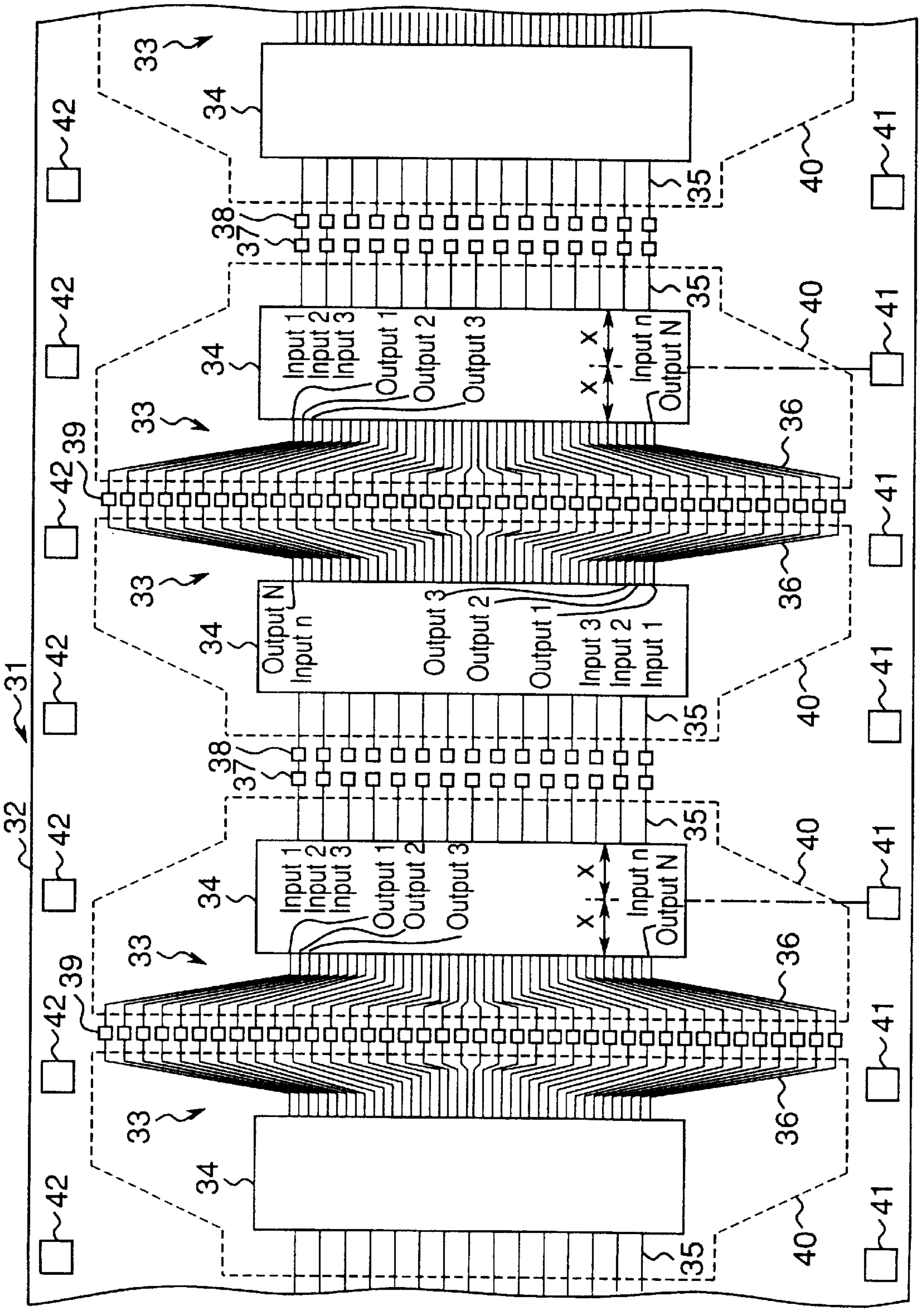
FIG. 6 is a plan view of a TCP different from that of FIG. 1.

FIG. 6 is a plan view of the TCP according to the present embodiment. A substrate 32, an LCD driver chip 34, input leads 35, output leads 36, output testing terminals 39 and sprocket holes 41 and 42 provided for a TCP 31 have the same constructions and operations as those of the substrate 12, LCD driver chips 14, input leads 15, output leads 16, output testing terminals 18 and sprocket holes 20 and 21 of the TCP 11 shown in FIG. 1.

According to the LCD driver chip of the present embodiment, two LCD driver chips 34 and 34 that are arranged adjacent to each other with the input leads 35 arranged opposite to each other function as a pair. Therefore, in the present embodiment, every other LCD driver chip 34 (the second and fourth LCD drivers 34 from the left in FIG. 6) is arranged in positions where the coordinates of the center thereof coincide with the coordinates of the centers of the sprocket holes 41 and 42 in the lengthwise direction of the substrate 32. In this case, two LCD drivers 34 can be arranged at three-pitch intervals of the sprocket holes 41, 42, and the length of the substrate 32 per LCD driver is 7.125 mm (=4.75 mm×3/2). Therefore, the total length of the substrate 32 can be reduced in comparison with the case of the conventional TCP shown in FIG. 10, allowing cost reduction to be achieved.

Figure 7:
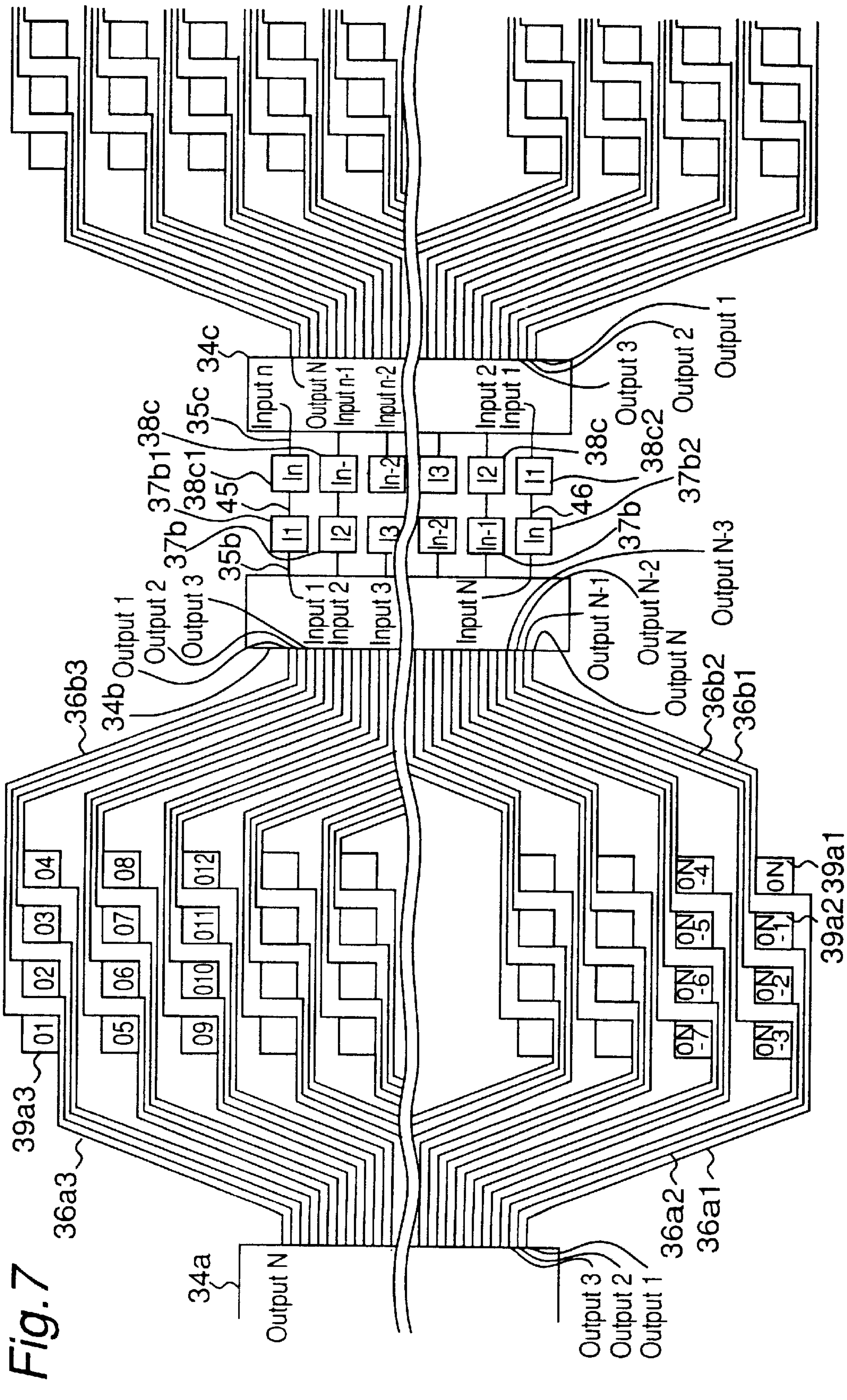
FIG. 7 is a view showing a practical arrangement of the output testing terminals of FIG. 6.

The adjoining two LCD driver chips 14 and 14 of the first embodiment have one input testing terminal 17 in common. In the present embodiment, the two LCD driver chips 34 that function as a pair independently have the respective input testing terminals 37 and 38. Then, the input testing terminals 37 and 38 are constructed as shown in FIG. 7.

That is, the input terminal 1 of the LCD driver chip 34*b* is connected to an input testing terminal $37b_1$ (I1) via an input lead 35*b*, further to an input testing terminal $38c_1$ (In) of an LCD driver chip 34*c* via a connection lead 45 and also to the input terminal n of the LCD driver chip 34*c* via an input lead 35*c*. The input terminal n of the LCD driver chip 34*b* is connected to the input terminal 1 of the LCD driver chip 34*c* via an input testing terminal $37b_2$ (In), a connection lead 46 and an input testing terminal $38c_2$ (I1). Further, there is provided similar connection between the input terminals 2 and (n−1) of the LCD driver chip 34*b* and the input terminals (n−1) and 2 of the LCD driver chip 34*c*. The input terminals 3 through (n−2) of the LCD driver chip 34*b* are connected to input testing terminals 37*b*. Likewise, the input terminals (N−2) through 3 of the LCD driver chip 34*c* are connected to input testing terminals 38*c*.

Also, in this case, referring to the electric power, for example, the GND is connected to the input terminal 1 and the input terminal n and further connected to the inside of the LCD driver chip 14 by internal wiring. The other electric power Vcc is inputted to the input terminal 2 and the input terminal (n−1) and further connected to the inside by internal wiring. As described above, concerning the terminals of the electric powers including the electric power to be applied to the LCD, the arrangement of the terminals has a symmetrical property as represented by the combination of the input terminal 1 and the input terminal n and the combination of the input terminal 2 and the input terminal (n−1) and so on with regard to the electric potentials of the input terminals of the LCD driver chip 34. Therefore, in FIG. 7, even if the input terminals 1, 2, (n−1) and n of the LCD driver chip 34*b* and the input terminals n, (n−1), 2 and 1, respectively, of the LCD driver chip 34*c* are connected together and an identical electric power is supplied to the terminals, then the normal application is achieved without causing any short circuit of the electric power or the like.

Figure 8:
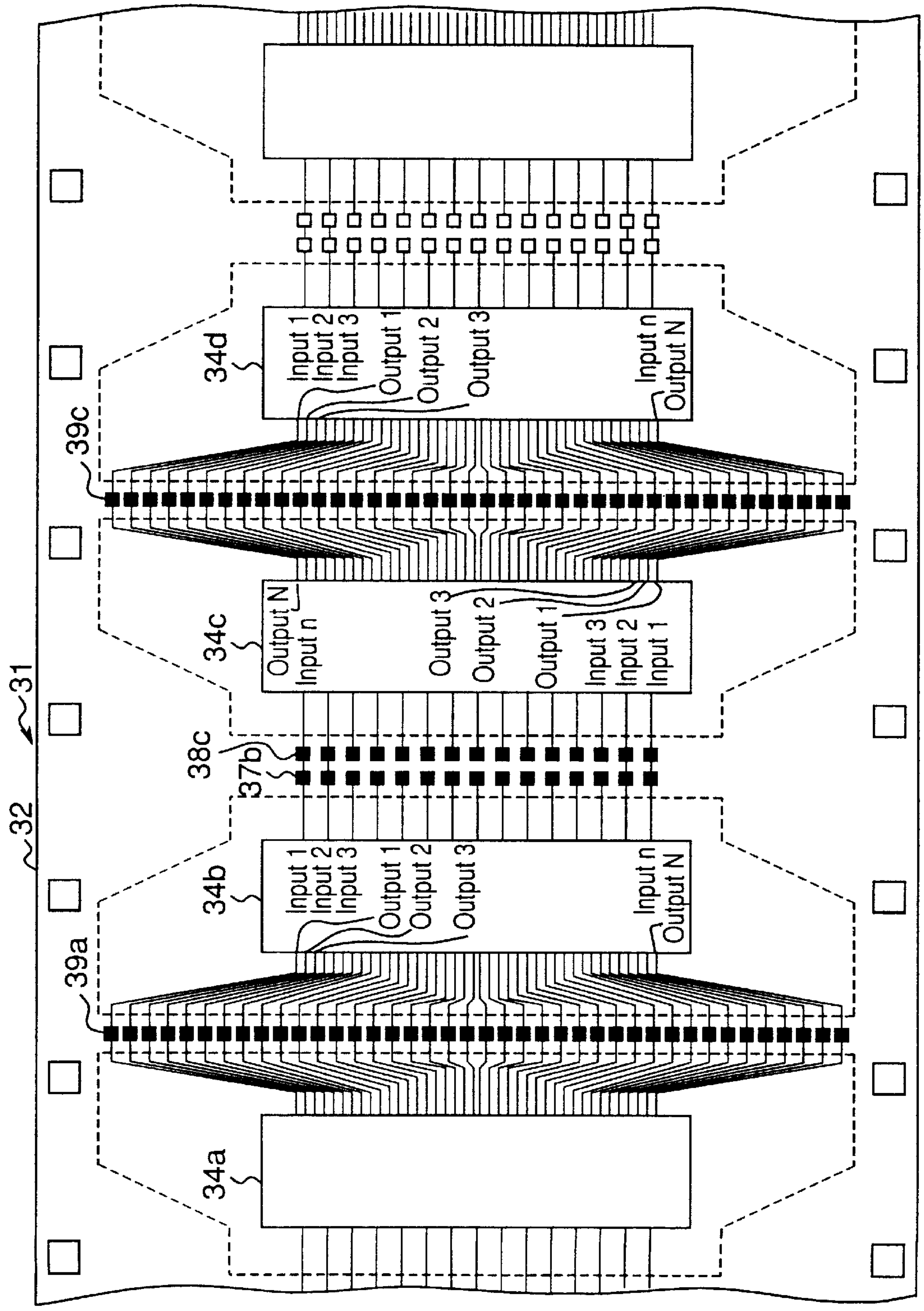
FIG. 8 is a view showing the probe positions of a TCP testing probe card for the TCP of FIG. 6.

FIG. 8 shows the probe positions of a TCP testing probe card. The test of the LCD driver chips 34*b* and 34*c* that function as a pair of the present embodiment will be described with reference to FIG. 8. The test of the LCD driver chips 34*b* and 34*c* of the present embodiment differs as follows according to the relation of arrangement of the input terminals other than those of the electric powers.

Reference is first made to the case where the arrangement of the input terminals other than those of the electric powers has a symmetrical property similarly to the input terminals of the electric powers. In this case, the electric power of an identical electric potential or the signal of an identical electric potential is inputted to the input terminals of the same ordinal numbers when the terminals are viewed from both ends of the LCD driver chip 34. Therefore, in this case, there is no problem if an identical signal is inputted to the mutually opposite input testing terminals 37*b* and 38*c*. Accordingly, when testing the LCD driver chip 34*b* and the LCD driver chip 34*c*, by applying a specified identical input to the input testing terminals 37*b* and 38*c* indicated in black with the probes of the probe card applied to the terminals and alternately measuring the outputs 1 through N with the probes of the probe card applied to output testing terminals 39*a* and 39*c* indicated in black, it can be determined whether or not both the LCD driver chips 34*b* and 34*c* that function as a pair are good.

Reference is next made to the case where the arrangement of the input terminals of the signals other than those of the electric powers has no symmetric property and no internal wiring is provided. In this case, if a specified identical input is applied to the input testing terminals 37*b* and 38*c* indicated in black with the probes of the probe card applied to the terminals similarly to the aforementioned case in order to test, for example, the LCD driver chip 34*b* with regard to the input signals other than the electric powers, then no appropriate input signal is applied to the adjoining LCD driver chips 34*c*. However, in the above case, the test is to determine whether or not the input signal is appropriate, and therefore, the LCD driver chip 34*c* is not damaged. The test is practically executed as follows on the LCD driver chips 34*b* and 34*c* that function as a pair.

First, by applying a specified input signal to the input testing terminals 37*b* (38*c*) of the LCD driver chip 34*b*, the outputs 1 through N are measured at the output testing terminal 39*a* of the LCD driver chip 34*b*. After the test of the LCD driver chip 34*b* is thus completed, the input signal is inverted and the appropriate signal is inputted to the LCD driver chip 34*c*. That is, the input signal applied to the input terminal 1 of the LCD driver chip 34*b* is applied to the input terminal 1 of the LCD driver chip 34c positioned just on the opposite side. Then, the outputs 1 through N are measured at the output testing terminal 39c of the LCD driver chip 34c. In this case, since the electric powers are symmetrically arranged as described above, there is no problem if the input signal is inverted.

As described above, if the arrangement of the input terminals has no symmetrical property, then both the LCD driver chips 34b and 34c cannot be concurrently tested. However, once the probes of the probe card are applied, the two LCD driver chips 34 and 34 can be successively tested. This enables the reductions of the time for moving up and down the probe card per test of one LCD driver chip 34 and the time for the movement and positional alignment of the probe card to the next LCD driver chip 34 to be tested as well as the reduction of the time for the test itself, allowing cost reduction at the testing time to be achieved.

The number of probes of the probe card in the case of the probe positions of the TCP testing probe card shown in FIG. 8 becomes the number two times the sum total of the total number of the output terminals and the total number of the input terminals of the LCD driver chip 34, and accordingly, it is anticipated that the price of the probe card becomes high. However, since the two LCD driver chips 34 and 34 can be concurrently tested, cost reduction can be achieved by the reduction of the testing time. According to the construction of the present TCP 31, the input terminal n of the LCD driver chip 34b and the input terminal 1 of the LCD driver chip 34b are connected to the input terminal 1 of the LCD driver chip 34c and the input terminal n of the LCD driver chip 34c, respectively, via the connection leads 45 and 46. Therefore, the probing of either one of both the connected input terminals can be eliminated.

Figure 9:
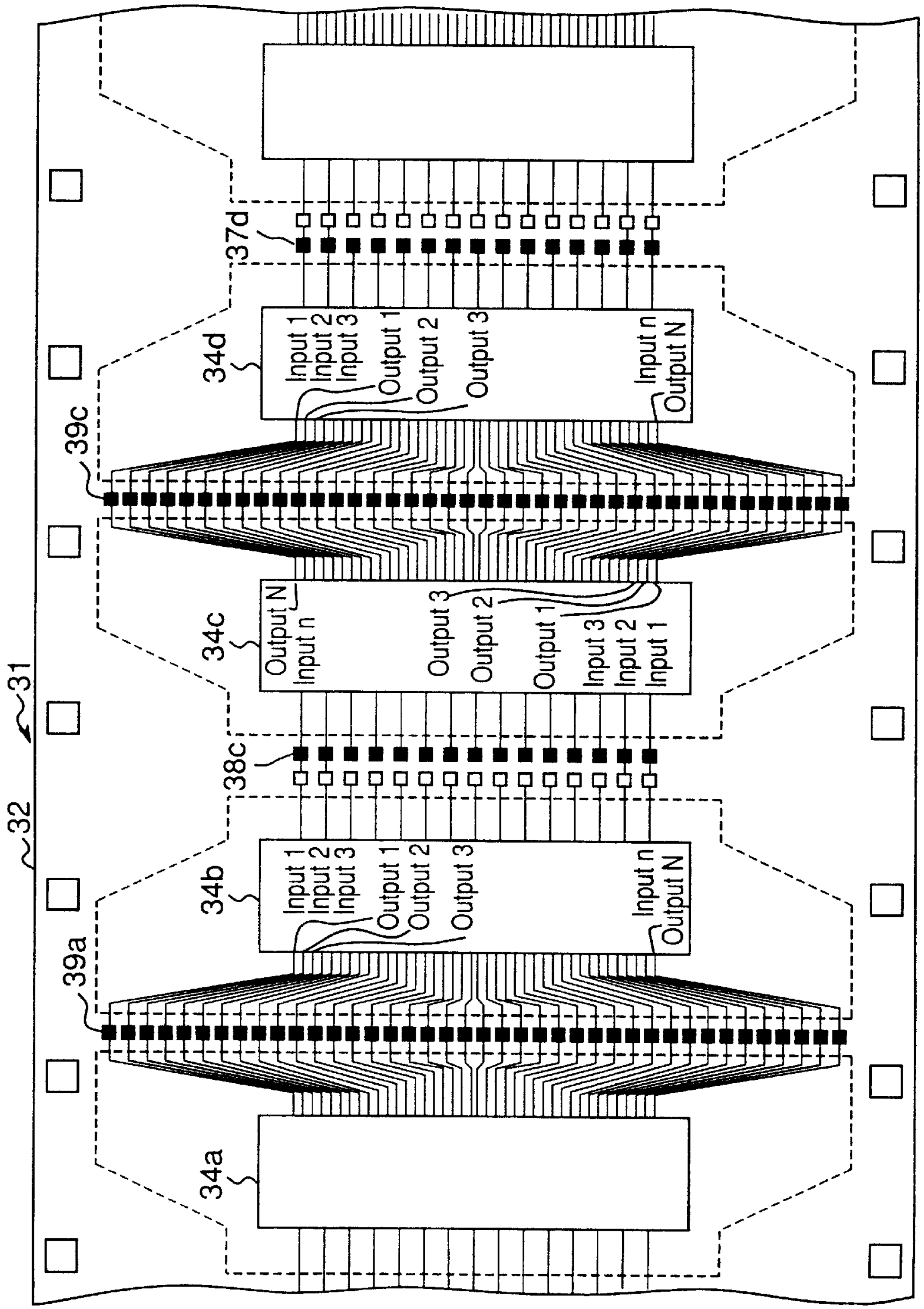
FIG. 9 is a view showing the probe positions of a TCP testing probe card different from those of FIG. 8.

FIG. 9 shows an explanatory view of the probe positions of the TCP testing probe card different from those of FIG. 8. When testing the LCD driver chips 34c and 34d, the probes of the probe card are applied to the input testing terminals 38c and 37d indicated in black and the output testing terminals 39c indicated in black in FIG. 9. In this case, by independently applying the input signals to the input testing terminal 38c of the LCD driver chip 34c and the input testing terminal 37d of the LCD driver chip 34d, the outputs can be individually observed at the output testing terminal 39c common to both the LCD driver chips 34c and 34d. The number of probes of the probe card in this case becomes the sum total of the number of the output terminals and the number two times the number of the input terminals of the LCD driver chip 34 similarly to the case shown in FIG. 5 differently from the case shown in FIG. 8. In general, the number of input terminals of the LCD driver chip 34 is smaller than the number of output terminals. Therefore, the price of the probe card can be suppressed to a price slightly higher than the conventional probe card.

It is required to bring the output of the LCD driver chip 34d into a high impedance state when testing the LCD driver chip 34c and bring the output of the LCD driver chip 34c into a high impedance state when testing the LCD driver chip 34d. When testing the LCD driver chip 34c, a specified voltage is applied to the input testing terminal 38c and the input testing terminal 37d is made open. When testing the LCD driver chip 34d, a specified voltage is applied to the input testing terminal 37d and the input testing terminal 38c is made open. In the case of the probe positions of the TCP testing probe card shown in FIG. 9, there is a method for inserting a switch or the like in the output stage (see FIG. 7) of the LCD driver chip 34 similarly to the case of the probe positions of the TCP testing probe card of the first embodiment shown in FIG. 5.

Figure 13:
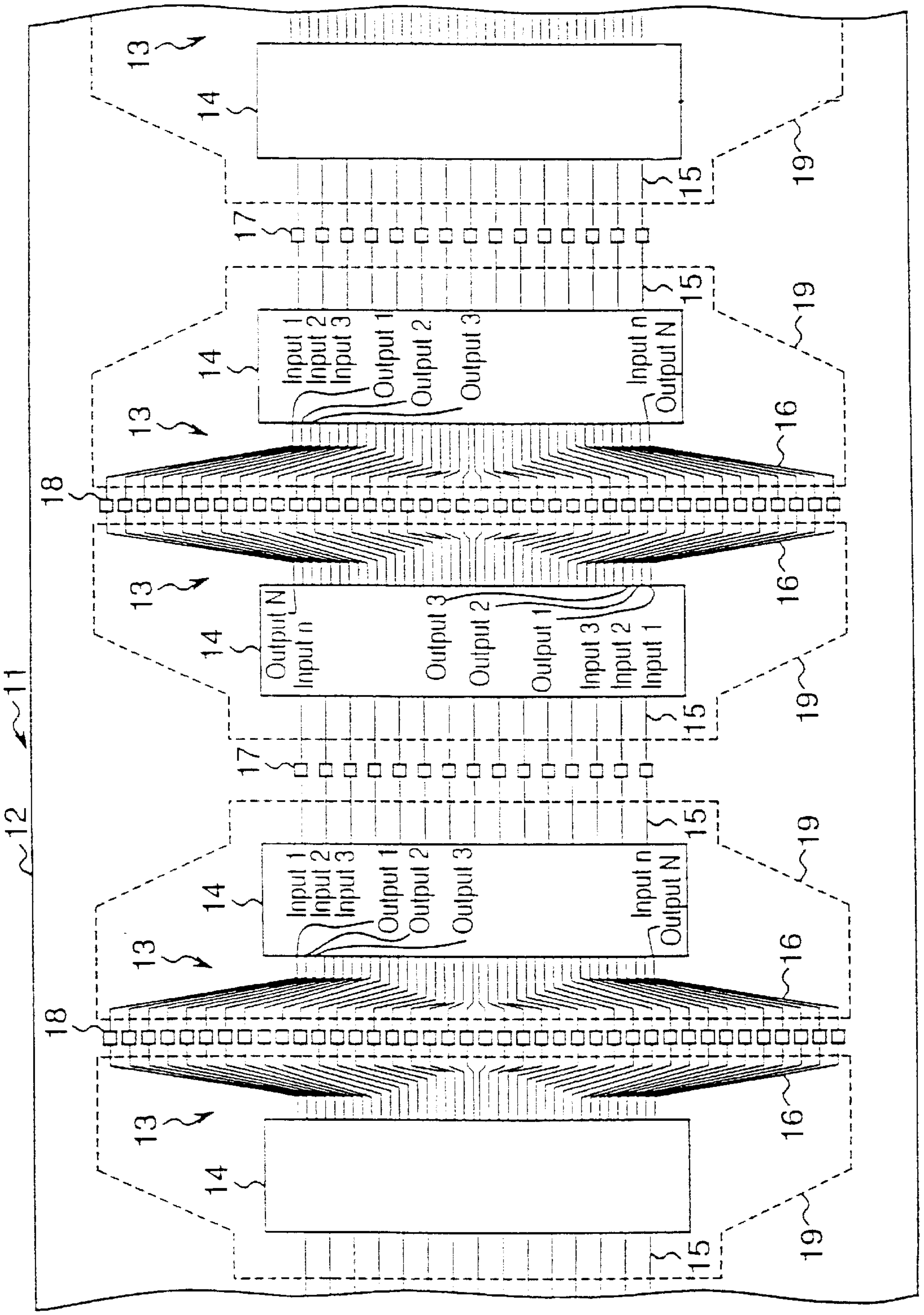
FIG. 13 is a plan view of a rectangular substrate used in another embodiment of the invention.

Although the aforementioned embodiments have been described taking the case of TCP as an example of the semiconductor device package, the present invention can also be applied to the COF (Chip on Film) mounting system. In the case of a flexible substrate to be used for the COF mounting system, this flexible substrate has a square or rectangular shape instead of the tape-like shape, as shown in FIG. 13. Therefore, in this case, the components relevant to the positional relation between the sprocket holes and the LCD driver chips are eliminated from the case of TCP, and the other components have the same constructions. Therefore, also in the case of the flexible substrate to be used for the COF mounting system, it is possible to effectively utilize the substrate, reduce the testing time of the LCD driver chips and achieve cost reduction.

As is apparent from the above, according to the semiconductor chip of the present invention, the input terminals are arranged so that the electric powers of an identical electric potential or the signals of an identical electric potential are supplied to the input terminals of the same ordinal numbers when viewed from both sides of the semiconductor chip. Therefore, the sequence of the signals to be inputted to the input terminal array may be reversed. Furthermore, if the two semiconductor chips are arranged with their input terminals arranged opposite to each other, then the electric power short circuit can be prevented from occurring even when an identical electric power is supplied to the input terminals that are opposite to each other.

According to the semiconductor device package of one embodiment, adjoining two semiconductor chips are arranged so that the direction of either one of the chips is rotated at an angle of 180 degrees relative to the other. With this arrangement, an identical electric power or signal can be inputted to the mutually opposite input terminals of the adjoining two semiconductor chips. Therefore, the input testing terminals of both the semiconductor chips can be commonized, allowing the arrangement pitch per semiconductor chip to be reduced.

According to the semiconductor device package of one embodiment, the mutually opposite input terminals of the adjoining two semiconductor chips are connected together by way of an input lead, and the mutually opposite output terminals of the adjoining two semiconductor chips are connected together by way of an output lead. With this arrangement, the distance between the input terminals and the distance between the output terminals of the adjoining two semiconductor chips are reduced, allowing the arrangement pitch per semiconductor chip to be reduced.

According to the semiconductor device package of one embodiment, the input lead is provided with an input testing terminal common to the adjoining two semiconductor chips, and the output lead is provided with an output testing terminal common to the adjoining two semiconductor chips. With this arrangement, the input testing terminal of either one of the adjoining two semiconductor chips and the output testing terminal of either one of the adjoining two semiconductor chips are eliminated, allowing the distance between the input terminals and the distance between the output terminals to be reduced. Therefore, the arrangement pitch per semiconductor chip is reduced, allowing cost reduction to be achieved.

According to the semiconductor chip of one embodiment, the input terminals are arranged so that the electric powers of an identical electric potential or the signals of an identical electric potential are supplied to part of the input terminals of the same ordinal numbers when viewed from both sides of the semiconductor chip. With this arrangement, the signals to be inputted to the input terminals to which the electric powers of an identical electric potential or the signals of an identical electric potential are to be inputted may be reversed. Furthermore, if the two semiconductor chips are arranged with their input terminals arranged opposite to each other, then the electric power short circuit can be prevented from occurring even when an identical electric power is supplied to the input terminals that are opposite to each other.

According to the semiconductor device package of one embodiment, the adjoining two semiconductor chips are arranged so that the direction of either one of the chips is rotated at an angle of 180 degrees relative to the other. With this arrangement, an identical electric power or signal can be inputted to the mutually opposite input terminals which belong to the adjoining two semiconductor chips and to which the electric power of an identical electric potential or the signal of an identical electric potential is inputted.

According to the semiconductor device package of one embodiment, two semiconductor chips of which the input terminals are opposite to each other function as a pair, and the mutually opposite output terminals of the adjoining two semiconductor chips are connected together by way of an output lead. With this arrangement, the distance between the output terminals of the adjoining two semiconductor chips can be reduced, allowing the arrangement pitch per semiconductor chip to be reduced.

According to the semiconductor device package of one embodiment, among the mutually opposite input terminals of the two semiconductor chips that function as a pair, the input terminals relevant to at least one pair among the input terminal pairs to which the electric power of an identical electric potential or the signal of an identical electric potential are supplied are connected together by way of a connection lead. Therefore, the pair of input terminals connected by the connection lead can be commonized.

According to the semiconductor device package of one embodiment, the output lead is provided with an output testing terminal common to the adjoining two semiconductor chips, and the input testing terminal is connected to the input terminal of each semiconductor chip. With this arrangement, the output testing terminal of either one of the adjoining two semiconductor chips is eliminated, allowing the distance between the output terminals of both the semiconductor chips to be reduced. Therefore, the arrangement pitch per semiconductor chip is reduced, allowing cost reduction to be achieved.

The semiconductor device package of one embodiment is a TCP obtained by mounting the semiconductor chip on a tape-shaped substrate. Therefore, the distance between the mutually opposite input terminals or the distance between the mutually opposite output terminals of the two semiconductor chips mounted on the tape-shaped substrate is reduced, allowing the arrangement pitch of the semiconductor chip to be reduced. Therefore, the substrate is effectively utilized, allowing cost reduction to be achieved. The above effect becomes more remarkable when the semiconductor chips are arranged in positional alignment with the sprocket holes of the substrate.

The semiconductor device package of one embodiment is provided by a COF mounting package obtained by mounting the semiconductor chip on a rectangular substrate. With this arrangement, the distance between the mutually opposite input terminals and the distance between the mutually opposite output terminals of the adjoining two semiconductor chips mounted on the rectangular substrate is reduced, allowing the arrangement pitch of the semiconductor chip to be reduced. Therefore, the substrate is effectively utilized, allowing cost reduction to be achieved.

The probe card of one embodiment is used for testing the semiconductor device package and is provided with probes that are arranged so as to be able to be concurrently connected to the input testing terminal common to the adjoining two semiconductor chips and the output testing terminals of the adjoining two semiconductor chips. With this arrangement, by supplying the signal and the electric power to the common input testing terminal and detecting the outputs of the output testing terminals of the semiconductor chips, the adjoining two semiconductor chips can be tested by proving at one time. Therefore, the testing time including the time for moving up and down the present probe card and the time for the movement and positional alignment of the probe card is reduced, allowing cost reduction to be achieved at the semiconductor chip testing time. In the above case, the input terminals of both the semiconductor chips are arranged so that the electric power of an identical electric potential or the signal of an identical electric potential is inputted to the input terminals of the same ordinal numbers when viewed from both ends of the respective semiconductor chips. Therefore, the adjoining two semiconductor chips can be tested by proving at one time without a hitch.

The probe card of one embodiment is used for testing the semiconductor device package and is provided with probes that are arranged so as to be able to be concurrently connected to the output testing terminal common to the adjoining two semiconductor chips and the input testing terminals of the adjoining two semiconductor chips. With this arrangement, by independently supplying the signals and the electric powers to the input testing terminals of the adjoining two semiconductor chips and successively detecting the outputs from the output testing terminal common to both the semiconductor chips, the adjoining two semiconductor chips can be tested by probing at one time. Therefore, the testing time including the time for moving up and down the present probe card and the time for the movement and positional alignment of the probe card is reduced, allowing cost reduction to be achieved at the semiconductor chip testing time.

In the above case, the number of input testing terminals is smaller than the number of the output testing terminals. Therefore, the number of probes of the present probe card can be made smaller than the number of probes of the claim 11.

The probe card of one embodiment is used for testing the semiconductor device package and is provided with probes that are arranged so as to be able to be concurrently connected to the input testing terminals of the two semiconductor chips that function as a pair and the output testing terminals of the two semiconductor chips. With this arrangement, if the input terminals that belong to the two semiconductor chips and function as a pair are arranged so that the electric power of an identical electric potential or the signal of an identical electric potential is inputted to the input terminals of the same ordinal numbers when viewed from both ends of the individual semiconductor chips, then the above two semiconductor chips can be tested by probing at one time by concurrently supplying the identical signal and electric power to the input testing terminals of the two semiconductor chips and alternately detecting the outputs of the output testing terminals of both the semiconductor chips.

Furthermore, if the input terminals of the two semiconductor chips that function as a pair are partially arranged so that the electric power of an identical electric potential or the signal of an identical electric potential is inputted to the input terminals of the same ordinal numbers when viewed from both ends of the individual semiconductor chips, then the adjoining two semiconductor chips can be tested by probing at one time by supplying a signal and an electric power to the input testing terminals of either one of the two semiconductor chips, detecting the output of the output testing terminal of the above semiconductor chip, subsequently supplying a signal and an electric power to the input testing terminals of the other semiconductor chip and detecting the output of the output testing terminal of the above semiconductor chip.

Therefore, according to the present embodiment, the testing time including the time for moving up and down the present probe card and the time for the movement and positional alignment of the probe card is reduced, allowing cost reduction to be achieved at the semiconductor chip testing time. In the above case, the probing of either one of the pair of input terminals that are mutually opposite and connected to each other by way of a connection lead can be eliminated.

The probe card of one embodiment is used for testing the semiconductor device package and is provided with probes that are arranged so as to be able to be concurrently connected to the output testing terminal common to the adjoining two semiconductor chips and the input testing terminals of the adjoining two semiconductor chips. With this arrangement, by independently supplying the signal and the electric power to the input testing terminals of the adjoining two semiconductor chips and successively detecting the output from the output testing terminal common to both the semiconductor chips, the adjoining two semiconductor chips can be tested by proving at one time. Therefore, the testing time including the time for moving up and down the present probe card and the time for the movement and positional alignment of the probe card is reduced, allowing cost reduction to be achieved at the semiconductor chip testing time.

In the above case, the number of input testing terminals is smaller than the number of the output testing terminals. Therefore, the number of probes of the present probe card can be made smaller than the number of the probes.

According to the package testing method of one embodiment, the mutually reversed signal input sequences or the mutually reversed signal detection sequences are applied to the adjoining two semiconductor chips with regard to at least one of the input testing terminal or the output terminal of the semiconductor chips when testing the adjoining two semiconductor chips by probing at one time. Therefore, the signal input or the signal detection of the adjoining two semiconductor chips can be independently executed with the input testing terminals or the output terminals of the adjoining two semiconductor chips kept probed. That is, according to this invention, the test of the adjoining two semiconductor chips can be independently executed by proving at one time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device package, said package being arranged to facilitate testing and comprising:

a substrate;

a plurality of semiconductor chips with each one of said plurality of semiconductor chips being rectangular and having a plurality of input terminals 1–n (where n is an integer) along one side and a plurality of output terminals 1–N (where N is an integer) along a side opposite to said one side;

said plurality of semiconductor chips being mounted on said substrate with adjacent ones of said plurality of semiconductor chips being rotated 180° from each other so that:

(1) input terminal 1 of a first one of said plurality of semiconductor chips faces opposite to input terminal n of an adjacent one of said plurality of semiconductor chips and input terminal 2 of said first one of said plurality of semiconductor chips faces opposite to input terminal n−1 of said adjacent one of said plurality of semiconductor chips with such pairings continuing for all of said input terminals of said first one and said adjacent one of said plurality of semiconductor chips, and (2) output terminal 1 of said first one of said plurality of semiconductor chips faces opposite to output terminal N of another adjacent one of said plurality of semiconductor chips and output terminal 2 of said first one of said plurality of semiconductor chips faces opposite to output terminal N−1 of said another adjacent one of said plurality of semiconductor chips with such pairings continuing for all of said output terminals of said first one and said another adjacent one of said plurality of semiconductor chips each of said paired input terminals of said first one and said adjacent one of said plurality of semiconductor chips are interconnected by respective input leads; and each of said paired output terminals of said first one and said another adjacent one of said plurality of semiconductor chips are interconnected by respective output leads.

2. A semiconductor device package as claimed in claim 1, wherein:

each of said paired input leads of said first one and said adjacent one of said plurality of semiconductor chips are connected through respective input test terminals; and each of said paired output leads of said first one and said another adjacent one of said plurality of semiconductor chips are connected through respective output test terminals.

3. A semiconductor device package as claimed in claim 1, wherein the package is a tape carrier package obtained by mounting said plurality of semiconductor chips on a tape-shaped substrate.

4. A semiconductor device package as claimed in claim 1, wherein the package is a chip on film mounting package obtained by mounting said plurality of semiconductor chips on a rectangular substrate.

5. A probe card to be used for testing the semiconductor device package claimed in claim 2, comprising:

probes arranged to be concurrently connected to said input testing terminals common to said first and said adjacent ones of said plurality of semiconductor chips and said output testing terminals common to said first and said another adjacent ones of said plurality of semiconductor chips, whereby multiple ones of said plurality of semiconductor chips can be tested by probing at one time.

6. A semiconductor device package, said package being arranged to facilitate testing and comprising:

a substrate;

a plurality of semiconductor chips with each one of said plurality of semiconductor chips being rectangular and having a plurality of input terminals 1–n (where n is an integer) along one side and a plurality of output terminals 1–N (where N is an integer) along a side opposite to said one side;

said plurality of semiconductor chips being mounted on said substrate with adjacent ones of said plurality of semiconductor chips being rotated 180° from each other so that:

(1) input terminal 1 of a first one of said plurality of semiconductor chips faces opposite to input terminal n of an adjacent one of said plurality of semiconductor chips and input terminal 2 of said first one of said plurality of semiconductor chips faces opposite to input terminal n−1 of said adjacent one of said plurality of semiconductor chips with such pairings continuing for all of said input terminals of said first one and said adjacent one of said plurality of semiconductor chips, and (2) output terminal 1 of said first one of said plurality of semiconductor chips faces opposite to output terminal N of another adjacent one of said plurality of semiconductor chips and output terminal 2 of said first one of said plurality of semiconductor chips faces opposite to output terminal N−1 of said another adjacent one of said plurality of semiconductor chips with such pairings continuing for all of said output terminals of said first one and said another adjacent one of said plurality of semiconductor chips at least two of said paired input terminals of said first one and said adjacent one of said plurality of semiconductor chips being interconnected by respective inputs leads; and each of said paired output terminals of said first one and said another adjacent one of said plurality of semiconductor chips being interconnected by respective output leads.

7. A semiconductor device package as claimed in claim 6, wherein:

said at least two said paired input leads of said first one and said adjacent one of said plurality of semiconductor chips being connected through respective input test terminals; and each of said paired output leads of said first one and said another adjacent one of said plurality of semiconductor chips being connected through respective output test terminals.

8. A semiconductor device package as claimed in claim 6, wherein the package is a tape carrier package obtained by mounting said plurality of semiconductor chips on a tape-shaped substrate.

9. A semiconductor device package as claimed in claim 6, wherein the package is a chip on film mounting package obtained by mounting said plurality of semiconductor chips on a rectangular substrate.

10. A probe card to be used for testing the semiconductor device package claimed in claim 7, comprising:

probes arranged to be concurrently connected to said input testing terminals common to said first and said adjacent ones of said plurality of semiconductor chips and said output testing terminals common to said first and said another adjacent ones of said plurality of semiconductor chips, whereby multiple ones of said plurality of semiconductor chips can be tested by probing at one time.

11. A package testing method using the probe card of claim 10, comprising the step of:

applying mutually reversed test signal input sequences or mutually reversed test signal detection sequences to said adjacent ones of said plurality of semiconductor chips through at least one of said input testing terminals and at least one of said output terminals for testing said adjacent ones of said plurality of semiconductor chips by probing at one time.

* * * * *